(12) United States Patent
Nishimura

(10) Patent No.: US 7,411,789 B2
(45) Date of Patent: Aug. 12, 2008

(54) ONCE-THROUGH FORCED AIR-COOLED HEAT SINK FOR A PROJECTION DISPLAY APPARATUS

(75) Inventor: Yoshifumi Nishimura, Tokyo (JP)

(73) Assignee: NEC Viewtechnology, Ltd., Tokyo (JP)

( * ) Notice: Subject to any disclaimer, the term of this patent is extended or adjusted under 35 U.S.C. 154(b) by 91 days.

(21) Appl. No.: 11/452,253

(22) Filed: Jun. 14, 2006

(65) Prior Publication Data

US 2007/0000650 A1    Jan. 4, 2007

(30) Foreign Application Priority Data

Jul. 4, 2005    (JP) ............................. 2005-195164

(51) Int. Cl.
*H05K 7/20* (2006.01)
(52) U.S. Cl. ...................... 361/697; 361/695; 174/16.3; 165/80.3
(58) Field of Classification Search .................. None
See application file for complete search history.

(56) References Cited

U.S. PATENT DOCUMENTS

| | | | |
|---|---|---|---|
| 5,019,880 A | | 5/1991 | Higgins, III. |
| 5,077,601 A | * | 12/1991 | Hatada et al. ............... 257/722 |
| 5,297,005 A | | 3/1994 | Gourdine |
| 5,422,787 A | * | 6/1995 | Gourdine .................... 361/697 |
| 5,582,240 A | * | 12/1996 | Widmayer ................. 165/80.3 |
| 5,653,285 A | | 8/1997 | Lee |
| 5,763,950 A | * | 6/1998 | Fujisaki et al. .............. 257/712 |
| 5,917,697 A | * | 6/1999 | Wang ......................... 361/695 |
| 5,940,267 A | * | 8/1999 | Katsui et al. ................ 361/697 |
| 5,946,188 A | * | 8/1999 | Rochel et al. ............... 361/690 |
| 5,978,220 A | * | 11/1999 | Frey et al. ................... 361/699 |
| 6,113,485 A | * | 9/2000 | Marquis et al. ............. 454/184 |
| 6,145,586 A | * | 11/2000 | Lo .............................. 165/80.3 |
| 6,234,239 B1 | * | 5/2001 | Azar ........................... 165/80.3 |
| 6,404,630 B1 | * | 6/2002 | Lai ............................. 361/697 |
| 6,567,267 B1 | * | 5/2003 | Wang ......................... 361/695 |
| 6,655,449 B1 | * | 12/2003 | Hsien ......................... 165/80.4 |
| 6,690,577 B2 | * | 2/2004 | Chen .......................... 361/695 |
| 6,714,278 B2 | * | 3/2004 | Kamiya ...................... 355/30 |

(Continued)

FOREIGN PATENT DOCUMENTS

JP    7-115156    5/1995

(Continued)

OTHER PUBLICATIONS

European Search Report dated Jan. 10, 2007.

*Primary Examiner*—Boris L Chervinsky
(74) *Attorney, Agent, or Firm*—McGinn IP Law Group, PLLC

(57) ABSTRACT

A once-through forced air-cooled heat sink according to the present invention comprises: a heat sink portion which is configured to be attached to an object that is to be cooled; and a blower for introducing cooling air into the heat sink portion. The heat sink portion comprises: an air inlet; an air outlet; and fins for dissipating heat in the object with the aid of cooling air which is supplied by the blower. The air inlet, the air outlet, and the fins are arranged such that the cooling air is introduced from the air inlet, then cools the fins and flows to the air outlet in a once-through pattern.

20 Claims, 4 Drawing Sheets

U.S. PATENT DOCUMENTS

| | | |
|---|---|---|
| 6,729,383 B1 | 5/2004 | Cannell et al. |
| 6,888,720 B2 * | 5/2005 | Pfister et al. ................. 361/689 |
| 6,940,716 B1 * | 9/2005 | Korinsky et al. ............ 361/695 |
| 6,987,669 B2 * | 1/2006 | Chen .......................... 361/695 |
| 2003/0155106 A1 | 8/2003 | Malone et al. |
| 2005/0045313 A1 | 3/2005 | Scott |
| 2005/0047086 A1 | 3/2005 | Gedamu et al. |
| 2006/0227555 A1 * | 10/2006 | Nishimura et al. .......... 362/294 |

FOREIGN PATENT DOCUMENTS

| | | |
|---|---|---|
| JP | 7-159070 | 6/1995 |
| JP | 8-316388 | 11/1996 |
| JP | 11-26665 | 1/1999 |
| JP | 3120802 | 10/2000 |
| JP | 2003-259600 | 9/2003 |
| JP | 2004-193389 | 7/2004 |

* cited by examiner

ONCE-THROUGH FORCED AIR-COOLED HEAT SINK FOR A PROJECTION DISPLAY APPARATUS

The present application is based on, and claims priority from, J.P. Application No. 2005-195164, filed on Jul. 4, 2005, the disclosure of which is hereby incorporated by reference herein in its entirety.

BACKGROUND OF THE INVENTION

1. Field of the Invention

The present invention relates to a heat sink and a projection display apparatus using the same, and more particularly, to a forced air-cooled heat sink.

2. Description of the Related Art

Electronic devices tend to generate a larger amount of heat because of the requirement for higher performance and reduction in size. Therefore, various methods have been proposed for efficiently cooling such electronic devices. For example, Japanese Patent Laid-open Publication No. 2004-193389 discloses a heat sink which employs a refrigerant. In order to improve the characteristic of heat transfer and to cool each electronic device at a uniform temperature, heat transfer coefficient of a heat sink with regard to the refrigerant which flows inside differs at locations along a flow path, depending on the arrangement of electronic devices that are to be cooled. Japanese Patent Laid-open Publication No. 115156/95 discloses a heat sink, which employs a refrigerant, for cooling integrated circuits. In order to improve cooling efficiency and to reduce pressure loss, a protrusion, which is arranged beneath a refrigerant nozzle, is formed on the bottom of a heat sink, and corner areas are cut away to eliminate dead water zones. In a cooling apparatus disclosed in Japanese Patent Laid-open Publication No. 159070/95, through-holes which extend parallel to each other are provided inside the cooling apparatus, and through-holes adjacent to each other are connected together by U-shaped connection pipes to form a continuous refrigerant flow path.

In such a liquid-cooled heat sink employing a refrigerant, a closed loop is generally formed to allow the refrigerant to circulate from a pump to a heat receiving jacket (heat sink), a radiator, and back to the pump. A reservoir tank may also be used, as needed, in order to accommodate leaks and evaporation of cooling water. In a liquid-cooled heat sink, heat is radiated by a radiator. Since the radiator is an air-cooled heat sink having fins on the outer surface thereof, cooling air, similar to conventional heat sinks, needs to be supplied from surroundings. In other words, the refrigerant only transfers heat from a device that is to be cooled to the radiator, and it does not actually cool the devices. Consequently, an air-cooled heat sink system has been increasingly used to cool an electronic device, because it directly cools the heat sink for an electronic device by means of a blower, and, as a result, it facilitates the simplification of a cooling structure.

On the other hand, noise reduction has been required for home electric appliances, and technologies for noise reduction have been developed. This tendency is not limited to home electric appliances, and is being extended to general electronic devices. In particular, in the field of personal computer-related apparatuses, noise reduction is highly required for a peripheral device of a computer system such as a projection display apparatus, irrespective of the size of the apparatus, as well as for components of a computer system such as a magnetic disk drive, a CPU (Central Processing Unit) cooler, and a power supply cooler.

Since a projection display apparatus is equipped with components that generate particularly large amounts of heat, the components that generate heat need to be cooled in order to ensure performance and reliability. The cooling system is roughly classified into two types, i.e., air cooling system and liquid cooling (water cooling) system. The air cooling system which is used to cool electronic devices is further classified into natural air cooling system and forced air cooling system, and the latter is usually used because the former needs a wide heat transfer area due to low cooling efficiency. In the forced air cooling, a blower, which may be of various kinds, forces cooling air to flow against an object that is to be cooled, or exhausts cooling air that is heated in an apparatus. A heat sink may be provided to cool an optical component which is heated to a particularly high temperature. In order to enhance the effect of cooling an electronic device, it is necessary to employ a larger cooling blower or to increase the rotational speed of a blower. However, this may result in an increase in the noise of the cooling blower, and the increase in noise is still larger for an electronic device that is equipped with components that generate large amounts of heat. Furthermore, the increase in noise tends to be larger for small portable devices, because the rotational speed needs to be increased in order to limit the size of a blower.

In a conventional heat sink used in a projection display apparatus, an object is cooled by arranging a heat sink in an air flow, and dissipating heat, which is transferred from the object to the heat sink, by the air flow. In order to cool an object in this way, a space is required that allows cooling air to flow around the heat sink. Cooling air is heated to a high temperature, and causes the temperature to rise in the apparatus. Since heat dissipating efficiency of a heat sink is affected by the ambient temperature, heated air needs to be purged to the outside of the apparatus. Further, a large surface area is required to improve the heat dissipating efficiency of a heat sink, leading to an increased height of the fins. There is a need for a reduction in the size of an apparatus, as well as for the compatibility between cooling performance and noise reduction (lower noise) in a conventional projection display apparatus.

However, the aforementioned conventional air cooling technology that uses a heat sink has the following disadvantages. First, in a small projection display apparatus, it is necessary to operate a blower that is mountable in an apparatus at a high rotational speed in order to ensure a flow rate that is necessary to cool a projection display apparatus having a component that generates large amounts of heat. The increase in rotational speed is required in order to increase the flow rate and air pressure because a normal rotation speed is insufficient for a small blower to ensure a sufficient flow rate. However, the increase in rotational speed may result in larger noise. Further, rotation of a blower at a higher rotational speed tends to generate noise that is offensive to the ear. Therefore, even if noise level is kept low, the level of the noise may still seem to be higher because noise is offensive to the ear.

Secondly, a smaller projection display apparatus has a limited flexibility for the arrangement of components in the apparatus, as compared with a larger apparatus, leading to the difficulty of using natural air cooling that introduces cooling air from the outside of the apparatus.

Thirdly, since components occupy a higher ratio of internal space in case of a smaller projection display apparatus, as compared with a larger apparatus, it is more difficult to exhaust heat to the outside of the apparatus due to increased ventilation resistance inside the apparatus. The apparatus has to be cooled under the condition in which there is insufficient air flow inside the apparatus.

SUMMARY OF THE INVENTION

It is an object of the present invention to provide a forced air-cooled heat sink which has low-noise, is small in size, and exhibits high cooling efficiency. In particular, it is an object of the present invention to provide a forced air-cooled heat sink which is suitable for cooling a reflection display device in a small-size projection display apparatus.

A once-through forced air-cooled heat sink according to the present invention comprises: a heat sink portion which is configured to be attached to an object that is to be cooled; and a blower for introducing cooling air into the heat sink portion. The heat sink portion comprises: an air inlet; an air outlet; and fins for dissipating heat in the object with the aid of cooling air which is supplied by the blower. The air inlet, the air outlet, and the fins are arranged such that the cooling air is introduced from the air inlet, then cools the fins and flows to the air outlet in a once-through pattern. Accordingly, the heat sink can efficiently cool an object that is to be cooled without affecting the surroundings.

The blower may be connected to the air inlet by an air pipe. Alternatively, the blower may be connected to the air outlet by an air pipe.

The fins are preferably comprised of a plurality of groups, each group having fins in different configuration from the other groups. The fins of a first group may be arranged in an area near the air inlet and have a configuration and an arrangement which are suitable for distributing the cooling air that is introduced from the air inlet to other group.

Each fin of the first group may have an apex that faces a direction from which the cooling air flows, and the fins of the first group may be arranged in a staggered pattern.

A second group may include a plurality of plate-like fins that are arranged parallel to each other to direct the cooling air such that the cooling air flows between the fins along a longitudinal side of the fin. A third group may include a plurality of plate-like fins that are arranged in a staggered pattern to direct the cooling air such that the cooling air flows between the fins and flows along a staggered path. The third group is preferably arranged nearer to the air outlet than the second group.

According to another embodiment, an electronic apparatus comprises a component that is to be cooled, and the once-through forced air-cooled heat sink mentioned above is attached to the component. Typical electronic apparatus is a projection display apparatus.

The fins have different configurations depending on the locations in the heat sink. Therefore, the fins can be efficiently cooled by the cooling air that enters the heat sink portion with accelerated velocity, and all the fins are cooled efficiently.

Since the cooling air is exhausted to the outside via an exhaust pipe, the heat in the heat sink does not affect the surroundings. Since the outer surface of the heat sink is covered with a heat insulator, the heat sink is not affected by the heat of the surroundings.

The once-through forced air-cooled heat sink of the present invention has the advantage that reduction in size of an apparatus can be easily achieved, because the required velocity of the cooling air can be obtained even if the heat sink is small in size and the flow rate is limited. Further, since a small-size intake pipe can be used because of limited flow rate, it is easy to cover the high static pressure blower with an acoustic insulator. Accordingly, the once-through forced air-cooled heat sink of the present invention can further reduce the noise level, and also reduce noise having frequencies that are offensive to the ear.

The fins may be arranged such that the fins block a part of a flow path along which the cooling air flows from the air inlet to the air outlet in a once-through fashion.

The fins may prevent reduction in velocity of the cooling air.

The above and other objects, features and advantages of the present invention will become apparent from the following description with reference to the accompanying drawings which illustrate examples of the present invention.

DETAILED DESCRIPTION OF THE INVENTION

A once-through force air-cooled heat sink of the present invention has a heat sink portion and a blower that is communicated to heat sink portion. The heat sink portion has an air inlet and an air outlet, and is provided with fins inside the heat sink portion for dissipating heat. Cooling air is introduced from the air inlet by the blower, cools the heat dissipating fins, and is exhausted from the air outlet in a once-through flow pattern. The fins are comprised of fin groups in which configuration of the fins is different from that of other groups. The fins of the first group, which are arranged near the air inlet, have a configuration and an arrangement that is suitable for distributing the cooling air that is introduced from the air inlet to the other groups of fins. The fins of the other groups have a configuration and an arrangement that is suitable for being efficiently cooled by the cooling air that is introduced, depending on the location of each group, and that is suitable for smoothly exhausting the air from the air outlet. The fins are arranged such that the fins block a part of a flow path along which the cooling air flows from the air inlet to the air outlet in a once-through fashion.

Figure 1:
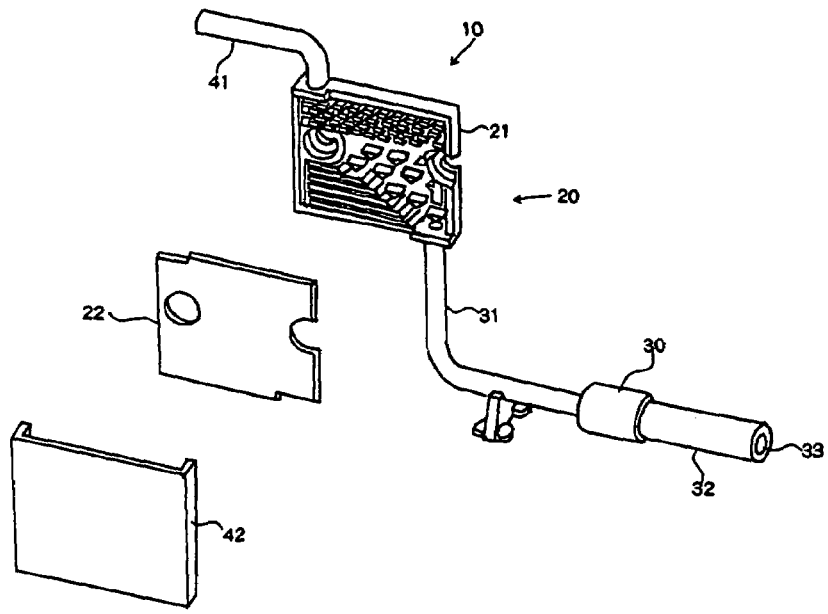
FIG. 1 is a schematic exploded perspective view of a once-through forced air heat sink according to the first embodiment of the present invention.
Figure 2A:
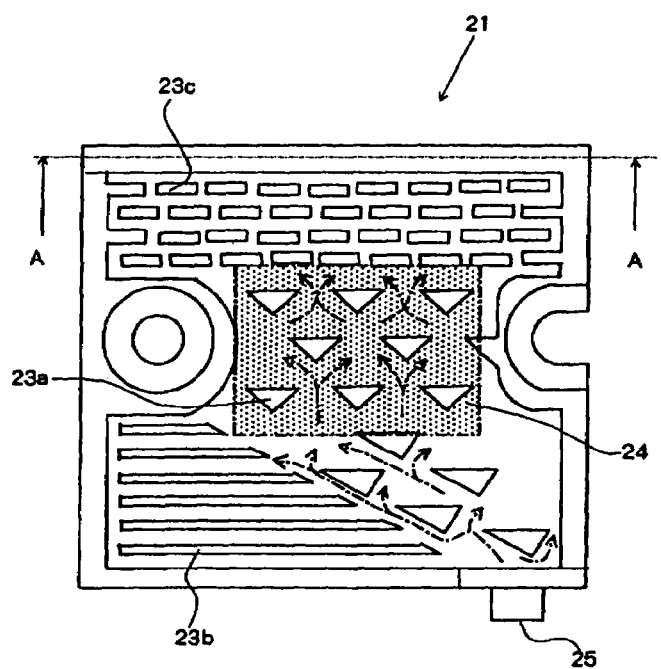
FIG. 2A is a top plan view illustrating the internal structure of the main body of the once-through forced air-cooled heat sink in FIG. 1.
Figure 2B:
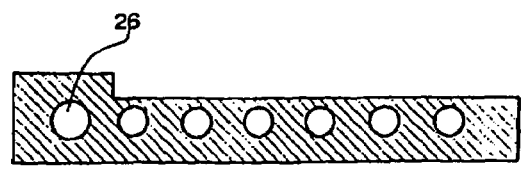
FIG. 2B is a cross-sectional view taken along line A-A in FIG. 2A.
Figure 3:
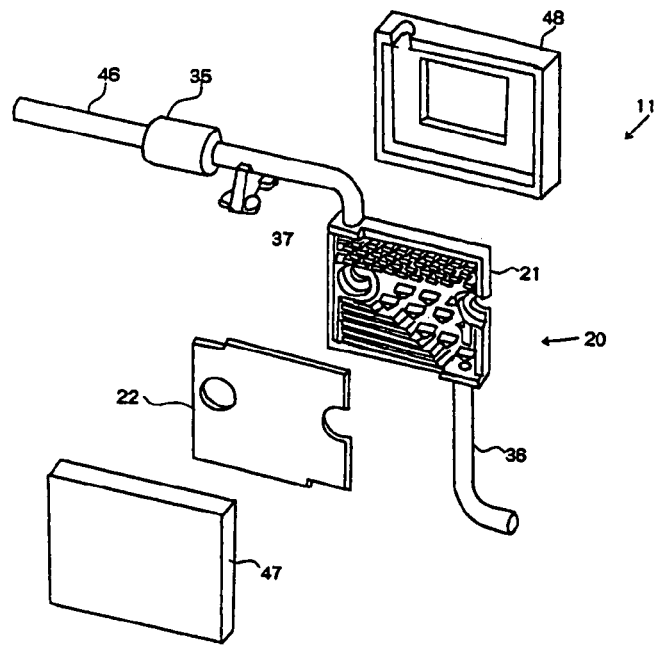
FIG. 3 is a schematic exploded perspective view of a once-through forced air heat sink according to the second embodiment of the present invention.

Referring to FIGS. 1 to 2B, a once-through forced air-cooled heat sink according to the first embodiment of the present invention will be described. Once-through forced air-cooled heat sink 10 is comprised of heat sink portion 20 and high static pressure blower 30 that is provided with intake pipe 32 and air supply pipe 31. Heat sink portion 20 comprises main body 21, which has fins and flow path 24 of cooling air therein, heat sink cover 22, and heat insulator 42. Main body 21 has a back surface that is in contact with a device that is to be cooled, such as a DMD (Digital Micromirror Device) of a projection display apparatus, and allows heat in the device that is to be cooled to be transferred to the fins. Since the temperature of heat sink portion 20 may rise due to ambient temperature, heat sink portion 20 is covered with heat insulator 42, as illustrated in FIG. 1, in order to prevent external heat from entering heat sink portion 20 through heat sink cover 22 and thereby to limit an increase in the temperature of heat sink portion 20. Since there is a flow of cooling air inside heat sink portion 20, and as a result, the increase in the temperature of the cooling air is limited, the efficiency of cooling a device that is to be cooled can be enhanced. If the influence of ambient temperature on heat sink portion 20 is small, then heat insulator 42 can be omitted. In this case, the function of the heat sink can still be achieved. If heat sink portion 20 is in contact with a device, which is to be cooled, only in a small area, then heat insulator 42 may also be provided on the side of heat sink portion 20 except for the area that is in contact with the device, as illustrated in FIG. 3. This configuration provides a more reliable heat insulating structure which is less affected by the ambient temperature.

Air supply nozzle 25 is provided at the air inlet of main body 21. High static pressure blower 30 is connected to main body 21 via air supply pipe 31 in order to supply cooling air to flow path 24 of main body 21. According to the mass conservation law, which states that the flow rate can be calculated by multiplying the velocity and an area, flow rate Q that is provided by high static pressure blower 30 is given by Q=A·v, where A represents the inner cross-sectional area of air supply pipe 31 having inner diameter a, and v represents the velocity. Since cooling air is supplied by high static pressure blower 30 via air supply pipe 31 to allow the area of flow passage (air supply pipe 31) to be reduced in the cross-sectional area, the velocity can be increased even for a small flow rate. The cross-sectional area of the flow passage is further reduced at air supply nozzle 25 of heat sink portion 20, allowing the cooling air to enter heat sink portion 30 at a higher velocity. Further, flow path 24 has a narrow width inside heat sink portion 20. Therefore, cooling air flows through flow path 24 without experiencing a reduction in velocity. The amount of heat that is transferred from the fins to the cooling air is correlated to the temperature difference and the velocity of the cooling air on the fins. The amount of heat that is transferred per unit time is increased in accordance with the increase in the velocity of the cooling air on the fins. If air supply pipe 31 is not used, the velocity would be reduced because of the increase in the cross-sectional area of the flow passage. In addition, intake port 33 can also be reduced in size because air supply pipe 31 can achieve cooling with a very low flow rate.

Any blower which is small in size and which provides a high static pressure may be used as high static pressure blower 30. For example, a pump-type blower, which sequentially compresses a plurality of diaphragms by rotation of a motor, can provide a pressure of 50 kPa or more. A multi-stage axial-flow pump may be used as well. Bower 30 may have a discharge pressure of any magnitude. For example, the discharge pressure of blower 30 may be less than 10 kPa, or may be more than 100 kPa.

The cooling air flows around the fins to cool them and flows to exhaust ports 26, as shown in FIG. 2B, along a predetermined once-through path, and is exhausted to the outside. As illustrated in FIG. 2B, a plurality of exhaust ports 26 facilitates exhausting the cooling air which is heated in flow path 24 inside heat sink portion 20. Since the heated cooling air does not remain in flow path 24 for a long time, the efficiency with which a device is cooled can be improved.

As illustrated in FIG. 1, exhaust pipe 41 may be connected to one of the exhaust ports 26, and the remaining exhaust ports 26 may be closed or eliminated. The air that is to be exhausted can be transferred through exhaust pipe 41 to a location where the influence of the exhausted air that has been heated is small.

Several heat sinks of the present invention may be connected in series. For example, the air outlet (exhaust port) of a first heat sink may be connected to the air inlet of a second heat sink by an exhaust pipe. A single blower can be used to cool a plurality of heat sinks for a plurality of devices.

As illustrated in FIG. 2A, the group of first fins 23a, the group of second fins 23b, and the group of third fins 23c, which are different from other groups in the configuration of the fins, are arranged in flow path 24 inside main body 21. An inlet air supply nozzle 25 and a plurality of exhaust ports 26 are provided on opposite side surfaces of main body 21. There are no openings in heat sink portion 20 except for inlet air supply nozzle 25 and exhaust ports 26 when heat sink cover 22 is attached to main body 21. The back side of main body 21 is in contact with a device that is to be cooled. Therefore, the group of first fins 23a, the group of second fins 23b, and the group of third fins 23c are configured and arranged such that the cooling air that is supplied by high static pressure blower 30 flows through the entire flow path 24 of main body 21 with which the device that is to be cooled is in contact. The fins can prevent reduction in velocity of the cooling air.

Next, a description will be given of the group of first fins 23a, the group of second fins 23b, and the group of third fins 23c. The following description is given only by way of example, and the configuration and arrangement of the fins are not limited to the following embodiment, as long as the cooling air introduced via air supply nozzle 25 uniformly cools the fins, and, after cooling, is exhausted from exhaust ports 26 to the outside. The fourth embodiment is also an exemplary application of this embodiment.

The cooling air that is supplied by high static pressure blower 30 is introduced into heat sink portion 20 with a velocity that is increased at air supply nozzle 25. The group of first fins 23a, which is nearest to air supply nozzle 25, serves to uniformly distribute the cooling air, which is introduced from air supply nozzle 25 with a high velocity, to the entire fins. First fin 23a has the shape of an inverted triangle with one apex directed toward air supply nozzle 25. First fins 23 are arranged in a staggered pattern in an area near air supply nozzle 25 inside heat sink portion 20. The cooling air having a high static pressure flows against the two sides of each first fin 23a that includes the apex, and is distributed through flow path 24, as indicated by the arrows in FIG. 2A. The configuration of first fin 23a is not limited to the inverted triangle. Alternatively, first fin 23a may have, for example, an L-shaped configuration with a bend directed toward air supply nozzle 25, as long as it serves to uniformly distribute the cooling air, which is introduced with a high velocity, to the entire fins.

The group of second fins 23b is arranged adjacent to the group of first fins 23a. As illustrated in FIG. 2A, second fin 23b has a plate-like elongated rectangular configuration. The cooling air, which is distributed by the group of first fins 23a, flows along the plate-like surfaces and then returns to flow path 24. Since only cooling air with a low static pressure flows in this area because of the configuration of the fins, such a configuration is chosen in order to reduce the resistance.

The group of third fins 23c is arranged in an upper area relative to the group of first fins 23a, as viewed on the figure, i.e., near exhaust ports 26. As illustrated in FIG. 2A, third fin 23c has a plate-like elongated rectangular configuration. The cooling air, which is distributed by the group of first fins 23a, flows against the surfaces that are defined by the longer sides of fins 23c in the lowest row, as viewed in the figure, then passes between fins 23c to flow against fins 23c in the next row, then repeats flowing against the next fins and passing between the fins, before it is exhausted from exhaust ports 26. The cooling air tends to lose velocity in this area, though it still has a high static pressure. Therefore, third fins 23c form flow passages having small widths in heat sink portion 20 to prevent a reduction in velocity. Third fins 23c are arranged in a staggered pattern to facilitate distribution of the cooling air.

Referring next to FIG. 3, a description will be given of a once-through forced air-cooled heat sink according to the second embodiment of the present invention. Since the once-through forced air-cooled heat sink according to the second embodiment is identical in configuration and operation to the first embodiment except for the location of the high static pressure blower, the description of the same components will be omitted.

Once-through forced air-cooled heat sink 11, similar to once-through forced air-cooled heat sink 10 according to the first embodiment, has heat sink portion 20 and high static pressure blower 35. High static pressure blower 35, different from the first embodiment in which high static pressure blower 30 is arranged on the side of the air inlet of heat sink portion 20, is arranged on the side of the air outlet of heat sink portion 20. In accordance with this modification, intake pipe 37 is connected to the inlet side of high static pressure blower 35 instead of exhaust pipe 41 in the first embodiment, and exhaust pipe 46 is connected to the outlet side of high static pressure blower 35. Air supply pipe 36 for receiving cooling air is connected to air supply nozzle 25 of main body 21. Once-through forced air-cooled heat sink 11 is identical to once-through forced air-cooled heat sink 10 according to the first embodiment in the other configuration.

High static pressure blower 35 is connected to one exhaust port 26 via intake pipe 37 to suck cooling air into heat sink portion 20. Cooling air is introduced into heat sink portion 20 from the outside via air supply pipe 36 and air supply nozzle 25. The cooling air cools fins in heat sink portion 20 in the same manner as in the first embodiment, and is sucked by high static pressure blower 35 to be exhausted to the outside from exhaust ports 26. Similar effects can be obtained in the second embodiment as in the first embodiment. Further, since the cooling air is not heated by the temperature rise in high static pressure blower 30, the fins are less affected by temperature.

In this way, the high static pressure blower can be arranged either on the air inlet side or on the air outlet side, leading to improved flexibility for arranging the once-through forced air-cooled heat sink. If both the intake point of the cooling air and the point at which the cooling air is exhausted are remote from once-through forced air-cooled heat sink 10, high static pressure blower 30 may be provided on the air inlet side, and high static pressure blower 35 may be provided on the air outlet side. Heat insulator 47 is provided on the front surface of heat sink portion 20, and heat insulator 48 is provided on the back surface of heat sink portion 20 in FIG. 3. However, the arrangement of the heat insulator is not limited to the embodiment, as described above.

Figure 4:
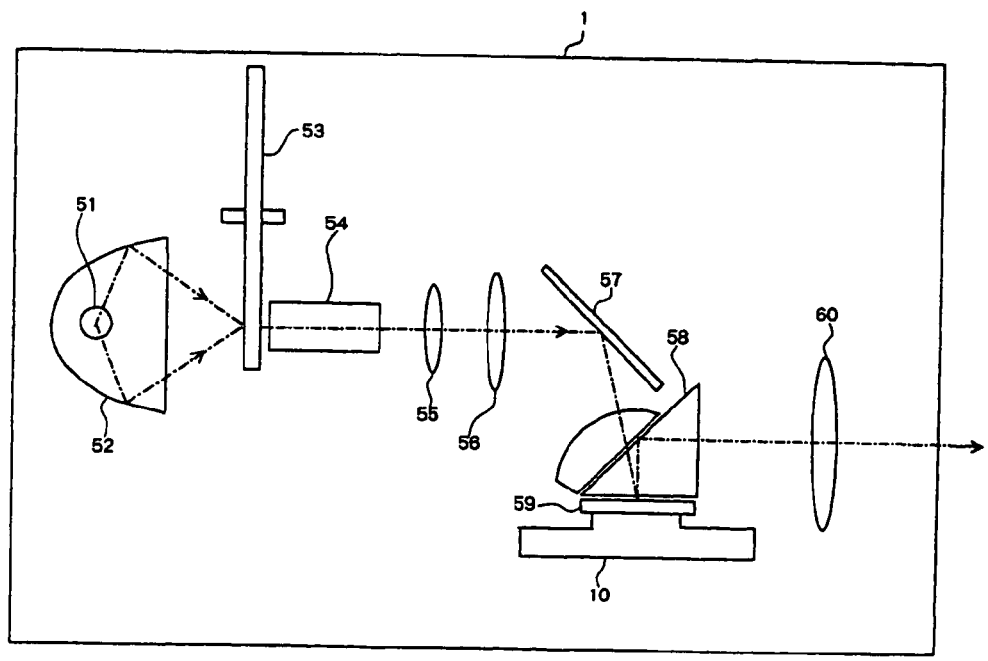
FIG. 4 is a schematic diagram illustrating the configuration of a projection display apparatus according to the third embodiment of the present invention.

Referring next to FIG. 4, a description will be given of a projection display apparatus as the third embodiment of the present invention. Projection display apparatus 1 has once-through forced air-cooled heat sink 10 or 11 according to the first or second embodiment. The following description will be given regarding an example in which once-through forced air-cooled heat sink 10 or 11 according to the first or second embodiment is used to cool DMD 58 which is an optical modulating device. However, the once-through forced air-cooled heat sink of the present invention may be used, for example, to cool a cold mirror, which is arranged on the emitting side of light source lamp 51 and which removes infrared rays that are included in the illumination system and that are generated by light source lamp 51. Alternatively, heat sink portion 20 may be used for other components that generate heat, such as a reflector of light source lamp 51. While the projection display apparatus is given as an example for the purpose of description, the once-through forced air-cooled heat sink of the present invention is not limited to the projection display apparatus, and can be applied to a variety of components of electronic devices which need cooling.

As illustrated in FIG. 4, in projection display apparatus 1, light that is emitted from light source lamp 51 is reflected by reflector 52, and is converged on a single point on color wheel 53, which has a combination of color filters to allow red, green, and blue light to selectively pass through. The light that is transmitted is uniformized by a light tunnel, not shown, which is disposed in rod integrator box 54, then passes through first condenser lens 55 and second condenser lens 56, and then is reflected in another direction by mirror 57. The light that is reflected in another direction is irradiated to DMD 58 via TIR (Total Internal Reflection) prism 58, and the resultant image light, or the light that is reflected by DMD 59, is projected onto a screen, not shown, through projection lens 60.

Once-through forced air-cooled heat sink 10 is in contact with DMD 59 so that the two components are thermally coupled to each other. As illustrated in FIGS. 1, 2, cooling air is sucked from intake port 33 of high static pressure blower 30, and fed into flow path 24 in heat sink portion 20 via air supply pipe 31 and air supply nozzle 25, which is arranged at the inlet of heat sink portion 20 of once-through forced air-cooled heat sink 10. After cooling the fins inside heat sink portion 20, the cooling air is exhausted from exhaust ports 26. Once-through forced air-cooled heat sink 11 according to the second embodiment may also be provided instead of once-through forced air-cooled heat sink 10.

Figure 5A:
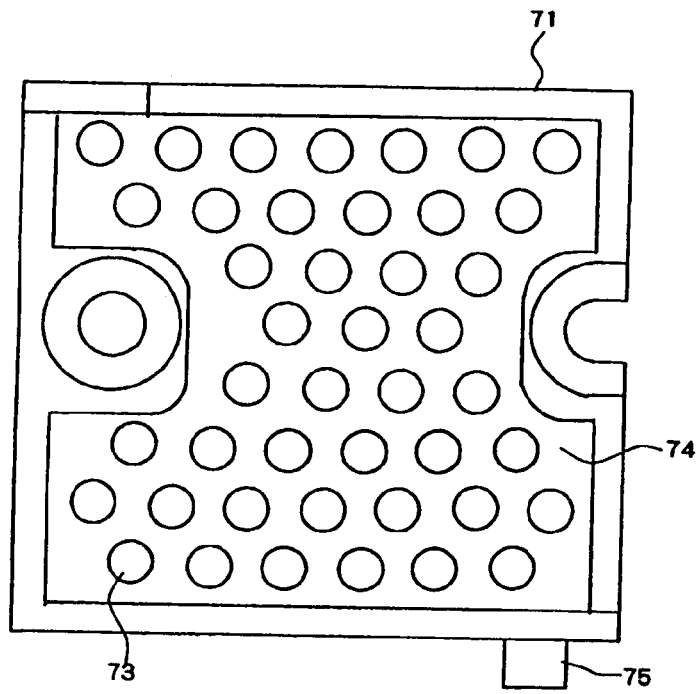
FIGS. 5A to 5B are schematic explanatory diagrams for illustrating the internal structure of the main body of a once-through forced air-cooled heat sink according to the fourth embodiment of the present invention.
Figure 5B:
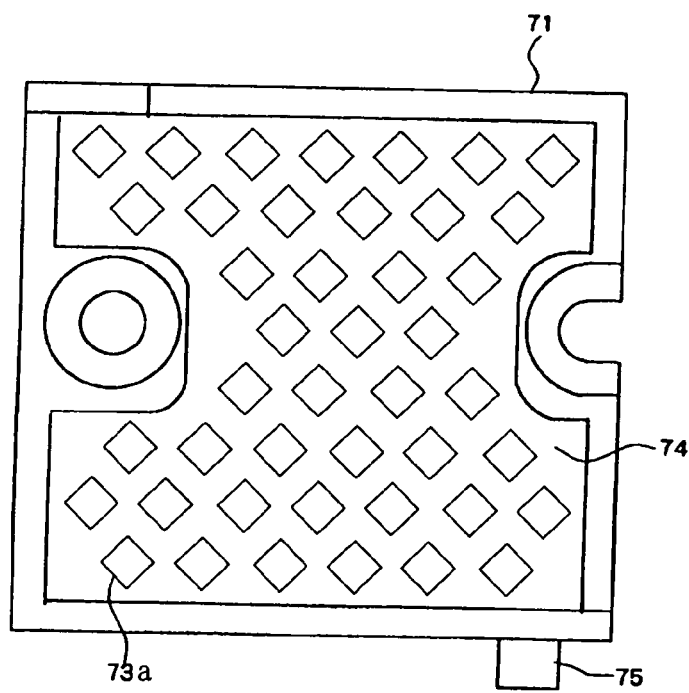

Referring next to FIG. 5A, a description will be given of a once-through forced air-cooled heat sink according to the fourth embodiment of the present invention. Since the once-through forced air-cooled heat sink according to the fourth embodiment is identical in configuration to once-through forced air-cooled heat sink 10 according to the first embodiment except for the configuration and arrangement of fins, the description of the same components will be omitted. All of fins 73 in main body 71 have the same cylindrical shape, and are arranged in a staggered pattern in cooling air flow path 74. Alternatively, the heat sink may be provided with diamond shaped fins 73a, as shown on FIG. 5B. The cooling air that is introduced from air supply nozzle 75 passes through flow path 74. The once-through forced air-cooled heat sink that has such a configuration and an arrangement of fins can also demonstrate similar effects to those of once-through forced air-cooled heat sink 10 according to the first embodiment.

Figure 6:
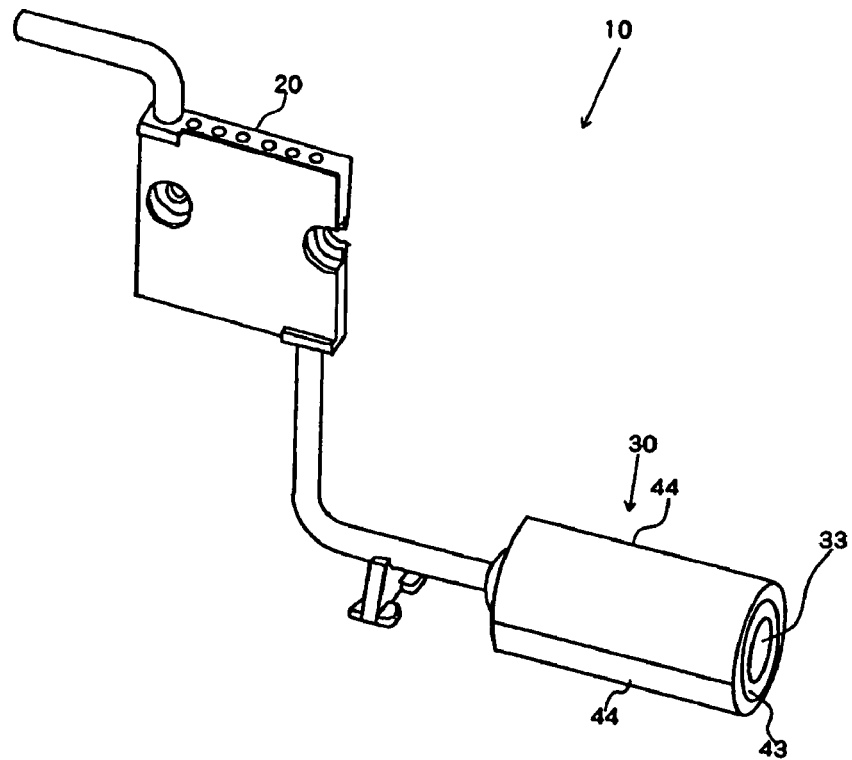
FIG. 6 is a schematic perspective view of a once-through forced air-cooled heat sink according to the fifth embodiment of the present invention.

Referring next to FIG. 6, a description will be given of a once-through forced air-cooled heat sink according to the fifth embodiment of the present invention. Since the once-through forced air-cooled heat sink according to the fifth embodiment is identical in configuration to once-through forced air-cooled heat sink 10 according to the first embodiment except that high static pressure blower 30 is covered with acoustic insulator 43 and acoustic insulation cover 44, the description of the same components will be omitted. High static pressure blower 30 of once-through forced air-cooled heat sink 10 is covered with acoustic insulator 43 and acoustic insulation cover 44, as illustrated in FIG. 6. Such a structure for acoustic insulation can reduce noise that is generated by high static pressure blower 30, as well as sound that is offensive to the ear. This structure for acoustic insulation can also be applied to high static pressure blower 35 in the second embodiment.

Since the small-size projection display apparatus according to the third embodiment employs the once-through forced air-cooled heat sink of the present invention, it is possible to reduce the dimensions of the heat sink that is required to cool a DMD, and thereby to reduce the limitation as to where the heat sink can be positioned in an electric apparatus. Further, the use of a high static pressure blower can improve cooling efficiency, while reducing the noise level and limiting the generation of sound having frequencies that are offensive to the ear.

Although a certain preferred embodiments of the present invention have been shown and described in detail, it should be understood that various changes and modifications may be made without departing from the spirit or scope of the appended claims.

What is claimed is:

1. A once-through forced air-cooled heat sink comprising:
a heat sink portion which is configured to be attached to an object that is to be cooled; and
a blower for introducing cooling air into said heat sink portion,
wherein said heat sink portion comprises:
an air inlet;
an air outlet; and
fins for dissipating heat in said object with an aid of cooling air which is supplied by said blower,
wherein said fins comprise a plurality of groups, including a group having fins with a configuration which is different from other groups, said plurality of groups including a first group which directs said cooling air from said air inlet to another group, and
wherein said air inlet, said air outlet, and said fins are arranged such that the cooling air is introduced from said air inlet, then cools said fins and flows to said air outlet in a once-through pattern.

2. The heat sink according to claim 1, wherein said blower is connected to said air inlet by an air pipe.

3. The heat sink according to claim 1, wherein said blower is connected to said air outlet by an air pipe.

4. The heat sink according to claim 1, wherein said fins of said first group are arranged in an area near said air inlet.

5. The heat sink according to claim 4, wherein each fin of said first group comprises an apex that faces a direction from which the cooling air flows, and said fins of said first group are arranged in a staggered pattern.

6. The heat sink according to claim 2, wherein said air inlet includes a nozzle having a smaller cross-sectional area than said air pipe.

7. The heat sink according to claim 4, wherein said another group includes:
a second group which includes a plurality of plate-like fins that are arranged parallel to each other to direct the cooling air such that the cooling air flows between said fins along a longitudinal side of said fin; and
a third group which includes a plurality of plate-like fins that are arranged in a staggered pattern to direct the cooling air such that the cooling air flows between said fins and flows along a staggered path, and
wherein said third group is arranged nearer to said air outlet than said second group.

8. The heat sink according to claim 1, wherein said air outlet comprises a plurality of said air outlets.

9. The heat sink according to claim 2, further comprising:
a single air outlet, and
an exhaust pipe, one end thereof being connected to said air outlet, and an other end thereof arranged at a predetermined location to exhaust the cooling air to the outside.

10. The heat sink according to claim 1, wherein at least part of an outer surface of said heat sink portion is covered with a heat insulator.

11. The heat sink according to claim 1, wherein said blower comprises a high static pressure blower.

12. The heat sink according to claim 1, wherein said blower is covered with an acoustic insulator.

13. An electronic apparatus comprising a component that is to be cooled, wherein the once-through forced air-cooled heat sink according to claim 1 is attached to said component.

14. The electronic apparatus according to claim 13, wherein said electronic apparatus comprises a projection display apparatus.

15. The heat sink according to claim 1, wherein said fins are arranged such that said fins block a part of a flow path along which the cooling air flows from said air inlet to said air outlet in a once-through fashion.

16. The heat sink according to claim 1, wherein said fins prevent reduction in velocity of the cooling air.

17. A once-through forced air-cooled heat sink comprising:
a heat sink portion which is configured to associate with an object to be cooled;
a blower to introduce air into the heat sink portion through an opening and to exhaust the air through a plurality of exhaust ports; and
plural fins to dissipate heat in the object by convection of the air against the plural fins, the air being supplied by the blower, the plural fins comprising:
a first fin group to receive air from the opening and to direct the air through an air flow path;
a second fin group to receive air from the flow path of the first fin group, to direct the air along an inner surface of the second fin group, and to then direct the air to the air flow path of the first fin group, and
a third fin group to receive air from the flow path of the first fin group, to direct the air along a plurality of inner surfaces of the third group, and to then direct the air to the plurality of exhaust ports.

18. The heat sink of claim 17, wherein the first fin group is provided in a middle area of the heat sink and a lower portion of the first fin group is provided adjacent to the opening.

19. The heat sink of claim 18, wherein the second fin group is provided in a portion of the heat sink that is offset from the opening by the first fin group and having a bottom portion nearest to the opening and a top portion farthest from the opening, where the bottom portion is wider than the top portion.

20. The heat sink of claim 17, wherein the third fin group is provided between the first fin group and the plurality of exhaust ports, and
wherein the third fin group comprises a plurality of layers, wherein a lowest layer of the plurality of layers is adjacent to the first fin group and the plurality of layers is configured for the air to flow against successive layers in the plurality of layers before the air exits through the exhaust port.

* * * * *